United States Patent [19]

Harita et al.

[11] Patent Number: 4,623,609

[45] Date of Patent: Nov. 18, 1986

[54] PROCESS FOR FORMING PATTERNS USING IONIZING RADIATION SENSITIVE RESIST

[75] Inventors: Yoshiyuki Harita, Kawasaki; Yoichi Kamoshida; Masashige Takatori, both of Yokohama; Kunihiro Harada, Machida, all of Japan

[73] Assignee: Japan Synthetic Rubber Co., Ltd., Tokyo, Japan

[21] Appl. No.: 735,715

[22] Filed: May 20, 1985

Related U.S. Application Data

[63] Continuation of Ser. No. 546,462, Oct. 28, 1983, abandoned, which is a continuation-in-part of Ser. No. 397,769, Jul. 13, 1982, abandoned.

[30] Foreign Application Priority Data

Jul. 24, 1981 [JP] Japan .................. 56-116156
Jan. 29, 1982 [JP] Japan .................. 57-12685
Oct. 29, 1982 [JP] Japan .................. 57-189148

[51] Int. Cl.$^4$ .......................... G03C 5/00
[52] U.S. Cl. .......................... 430/325; 430/270; 430/311; 430/296; 430/322; 526/247; 526/251; 526/292.9; 526/293
[58] Field of Search ............ 430/322, 325, 326, 296, 430/269, 270, 281, 311; 204/159.14, 159.22; 526/247, 292.9, 293, 251

[56] References Cited

U.S. PATENT DOCUMENTS 3,068,214 12/1962 Rassweiler et al. ............... 260/87.5
3,168,502 2/1965 Sexsmith et al. .................. 260/83.1
4,286,049 8/1981 Imamura et al. .................. 430/296

*Primary Examiner*—Jack P. Brammer

*Attorney, Agent, or Firm*—Oblon, Fisher, Spivak, McClelland & Maier

[57] ABSTRACT

An ionizing radiation sensitive resist consisting essentially of a polymer having a recurring unit represented by the following formula:

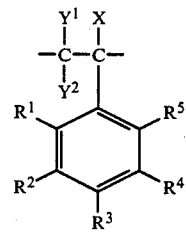

wherein X is a hydrogen atom, a methyl group, or a halogen atom and $R^1$, $R^2$, $R^3$, $R^4$ and $R^5$, which may be identical or different, are hydrogen atoms, halogen atoms, alkyl groups having 1 to 3 carbon atoms, alkoxy groups having 1 to 3 carbon atoms, haloalkyl groups having 1 to 3 carbon atoms or haloalkoxy groups having 1 to 3 carbon atoms, at least a part of the X groups present in said polymer being a halogen atom, at least a part of the $Y^1$ and $Y^2$ group present in said polymer being a halogen atom, and at least a part of the $R^1$, $R^2$, $R^3$, $R^4$ and $R^5$ groups present in said polymer being a haloalkyl or haloalkoxy group having 1 to 3 carbon atoms. Said ionizing radiation sensitive resist is suitable as a negative type resist. This resist is used in the form of an organic solvent solution to form a coating film on a substrate and the desired parts of this coating film are irradiated with an ionizing radiation, whereby patterns are formed.

13 Claims, 1 Drawing Figure

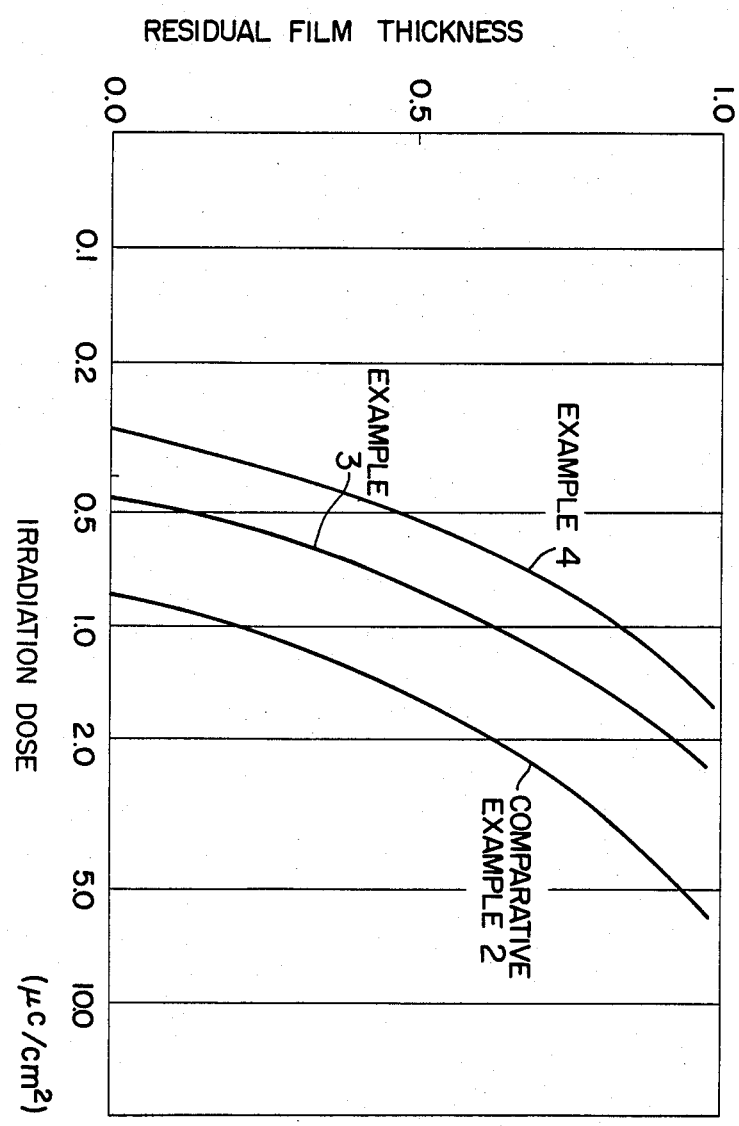

PROCESS FOR FORMING PATTERNS USING IONIZING RADIATION SENSITIVE RESIST

CROSS-REFERENCE TO RELATED APPLICATIONS

This application is a continuation of application Ser. No. 546,462, filed Oct. 28, 1983, now abandoned, which is a continuation in part of Ser. No. 397,769, filed July 13, 1982, now abandoned.

This invention relates to a negative type resist which is sensitive to ionizing radiations such as deep ultraviolet rays, electron beams, X-rays and the like.

Hitherto, the production of transistor, integrated circuit, etc. has been carried out by coating a photoresist on a substrate, irradiating the photoresist with light through a photo mask, dissolving the uncrosslinked part of the photoresist in a developer, and then subjecting to wet etching the part of the substrate other than patterns. However, such a series of steps using light have had a limit in resolution due to the diffraction phenomenon of light, and the wet etching process has been unable to achieve a sufficient etching of fine patterns because of side etch (a phenomenon that an etchant goes around to the underside of the pattern and etches that part) and the influence of impurities present in the etchant. For this reason, there has recently been developed a technique for forming a high-accuracy pattern by using ionizing radiations of high energy, such as deep ultraviolet rays, electron beams, X-rays and the like, which has a short wavelength, in place of light. Further, there has also been developed an etching technique for producing fine patterns not by the wet etching method but by a dry etching method using gas plasma, reactive ion etching, ion milling or the like.

When it is intended to form a pattern by irradiation with ionizing radiations followed by dry etching, the resist used must be highly sensitive to the ionizing radiations enough to form a fine pattern with a high accuracy and, at the same time, it must be highly resistant to dry etching. Although polystyrene is known at present as an example of resist material sensitive to ionizing radiations, it has the fault that its sensitivity to ionizing radiations is still low.

The present inventors have conducted elaborated studies with the aim of obtaining an ionizing radiation sensitive resist having a high sensitivity to ionizing radiations, capable of forming a fine pattern with a high accuracy and having a high resistance to dry etching. As a result, this invention has been accomplished.

According to this invention, there is provided an ionizing radiation sensitive resist which comprises a polymer having a recurring unit represented by the general formula (A):

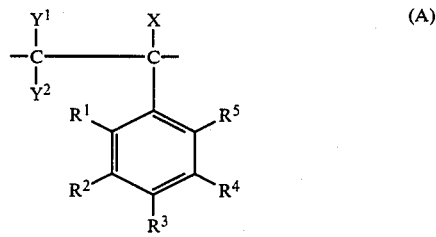

(A)

wherein X is a hydrogen atom, a methyl group or a halogen atom; $Y^1$ and $Y^2$, which may be identical or different, are hydrogen atoms, methyl groups or halogen atoms; and $R^1$, $R^2$, $R^3$, $R^4$ and $R^5$, which may be identical or different, are hydrogen atoms, alkyl groups having 1 to 3 carbon atoms (hereinafter referred to merely as the alkyl groups), alkoxy groups having 1 to 3 carbon atoms (hereinafter referred to merely as the alkoxy groups), halogen atoms, haloalkyl groups having 1 to 3 carbon atoms (hereinafter referred to merely as the haloalkyl groups) or haloalkoxy groups having 1 to 3 carbon atoms (hereinafter referred to merely as the haloalkoxy groups), at least a part of the X groups present in the polymer and at least a part of the $Y^1$ and $Y^2$ groups present in the polymer being halogen atoms, and at least a part of the $R^1$, $R^2$, $R^3$, $R^4$ and $R^5$ groups being the haloalkyl or haloalkoxy group.

In the polymer used in this invention, the proportion of the recurring unit represented by the general formula (A) wherein X is a halogen atom [said recurring unit being hereinafter referred to as the recurring unit (A-1)] is preferably 2 to 25% of the number of the total recurring units in the polymer, and more preferably, it is 5 to 20%. The proportion of the recurring unit represented by the general formula (A) wherein at least a part of the $R^1$, $R^2$, $R^3$, $R^4$ and $R^5$ groups is the haloalkyl or haloalkoxy group [said recurring unit being hereinafter referred to as the recurring unit (A-2)] is preferably 3 to 40%, more preferably 5 to 35%, of the number of the total recurring units in the polymer. Furthermore, the proportion of the recurring unit represented by the general formula (A) wherein at least a part of the $Y^1$ and $Y^2$ groups is a halogen atom [said recurring unit being hereinafter referred to as the recurring unit (A-3)] is preferably 2 to 25%, more preferably 5 to 20%, of the number of the total recurring units in the polymer. When the proportion of the recurring unit (A-1) is increased the resistance to dry-etching is enhanced, when the proportion of the recurring unit (A-2) is increased the sensitivity to electron beam or ultraviolet rays is enhanced, and the proportion of the recurring unit (A-3) contributes to the enhancement of resolution. Usually, the total sum of the proportions of the three recurring units may be varied depending on the method of synthesis, and it is preferably 7 to 70%, more preferably 9 to 60%, of the number of the total recurring units in the polymer.

The polymer has a total halogen content of preferably 1 to 50% by weight, more preferably 1 to 45% by weight, most preferably 1 to 25% by weight.

When X-rays are used as the ionizing radiations, a highly halogenated product is preferred from the viewpoint of absorption of X-rays, and the total halogen content of the polymer is preferably 5 to 50% by weight based on the weight of the polymer.

In this invention, the recurring unit represented by the general formula (A) wherein X is a halogen atom; at least one of the $R^1$, $R^2$, $R^3$, $R^4$ and $R^5$ groups is the haloalkyl or haloalkoxy group; and at least one of the $Y^1$ and $Y^2$ groups is a halogen atom is dealt with as the recurring units (A-1), (A-2) and (A-3). The recurring unit represented by the general formula (A) wherein X is a halogen atom; at least one of the $Y^1$ and $Y^2$ groups is a halogen atom; and $R^1$, $R^2$, $R^3$, $R^4$ and $R^5$ are hydrogen atoms, the alkyl groups, the alkoxy groups or halogen atoms, is dealt with as the recurring units (A-1) and (A-3).

In the recurring unit represented by the general formula (A), $R^1$, $R^2$, $R^3$, $R^4$ and $R^5$ may be, for example, hydrogen atoms, methyl groups, ethyl groups, propyl groups, methoxy groups, ethoxy groups, propoxy groups, chlorine atoms, bromine atoms, iodine atoms, fluorine atoms, chloromethyl groups, bromomethyl groups, chloroethyl groups, chloropropyl groups, chloromethoxy groups, iodomethoxy groups, bromomethoxy groups, iodopropyl groups, chloroethoxy groups, chloropropoxy groups, dichloromethyl groups, dibromomethyl groups, diiodomethyl groups, dichloroethyl groups, dibromoethyl groups, dichloropropyl groups, dibromopropyl groups, dichloromethoxy groups, dibromomethoxy groups, diiodomethoxy groups, dichloroethoxy groups, dibromoethoxy groups, dichloropropoxy groups, dibromopropoxy groups, trichloromethyl groups, tribromomethyl groups, trichloroethyl groups, tribromoethyl groups, trichloromethoxy groups, tribromomethoxy groups, or the like. Particularly preferred is the case where one of the $R^1$, $R^2$, $R^3$, $R^4$ and $R^5$ groups is methyl, chloromethyl, bromomethyl, dichloromethyl or dibromomethyl and the others are hydrogen atoms.

In the recurring unit (A), X, $Y^1$ and $Y^2$ include preferably chlorine, bromine, fluorine and iodine. The polymer may have two or more kinds of halogens bonded thereto.

Other recurring units which can form a polymer in combination with the recurring units represented by the general formula (A) include ethylenic unsaturated compound units such as ethyl (meth)acrylate unit, butyl (meth)acrylate unit, glycidyl (meth)acrylate unit, α-vinylnaphthalene unit, β-vinylnaphthalene unit, 2-vinylpyridine unit, 4-vinylpyridine unit, maleic anhydride unit and vinyl acetate unit; conjugated diene compound units such as butadiene unit and isoprene unit; and halogenated ethyleneic unsaturated compound units; and halogenated conjugated diene compound units. However, the proportion of the number of said other recurring units is preferably less than 50%, more preferably less than 20%, based on the number of the total recurring units in the polymer, from the viewpoint of sensitivity to ionizing radiations and resistance to dry etching.

The molecular weight of the polymer used in this invention is not critical, though a higher molecular weight is preferred for maintaining the performance of high sensitivity to ionizing radiations, whereas a lower molecular weight is preferred for facilitating the handling in forming a resist film. The range of the number average molecular weight satisfying these two contradictory requirements is preferably 10,000 to 1,500,000, and more preferably 10,000 to 1,000,000, as measured with a membrane osmometer.

The polymer of this invention can be produced by halogenating a polymer comprising recurring units represented by the general formula (B),

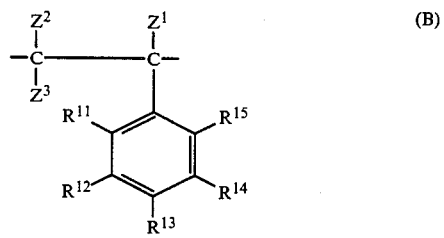

wherein $R^{11}$, $R^{12}$, $R^{13}$, $R^{14}$ and $R^{15}$ are hydrogen atoms, alkyl groups having 1 to 3 carbon atoms or alkoxy groups having 1 to 3 carbon atoms, provided that the case where all of $R^{11}$, $R^{12}$, $R^{13}$, $R^{14}$ and $R^{15}$ are hydrogen atoms is excluded; and $Z^1$, $Z^2$ and $Z^3$ are hydrogen atoms, fluorine atoms or methyl groups, provided that when $Z^1$ is methyl $Z^2$ and $Z^3$ are hydrogen atoms, alone or in combination with recurring units represented by the general formula (C),

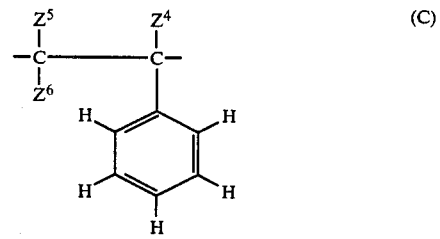

wherein $Z^4$, $Z^5$ and $Z^6$ are hydrogen atoms, fluorine atoms, or methyl groups, provided that when $Z^1$ in the general formula (B) is methyl $Z^4$ is a hydrogen atom, with a halogenating reagent radically, for instance, in the presence of a radical-generating agent or under the irradiation with light or ultraviolet rays.

Embodiments (1) and (2) of said production process are stated below.

(1) A process which comprises polymerizing a monomeric material comprising at least one monomer represented by the general formula (D):

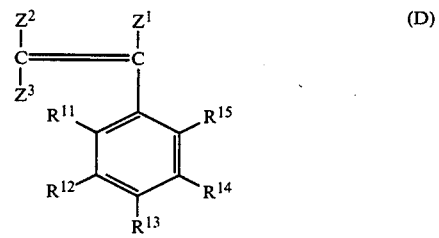

wherein $R^{11}$, $R^{12}$, $R^{13}$, $R^{14}$, $R^{15}$, $Z^1$, $Z^2$ and $Z^3$ have the same meanings as defined in the general formula (B), or a monomeric material comprising at least one monomer represented by the general formula (D) and at least one monomer represented by the general formula (E):

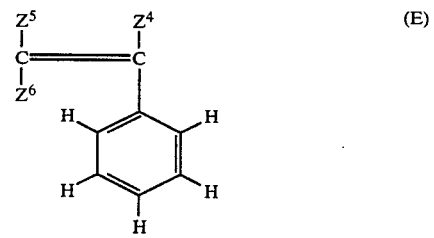

wherein $Z^4$, $Z^5$ and $Z^6$ have the same meanings as defined in the general formula (C), and subsequently, radically halogenating the resulting polymer, in the form of a solution in a solvent or in the state swollen with a solvent, with a compound having a halogen radical-generating ability such as t-butyl hypochlorite, t-butyl hypoiodite, chlorine, bromine or the like in the presence of a radical-generating agent such as 4,4'-azabisisobutyronitrile, benzoyl peroxide, lauroyl peroxide or the like or under the irradiation with light or ultraviolet-rays as described in, for example, the Journal of Americal Chemical Society, Vol. 82, 108 (1960).

(2) A process which comprises polymerizing a monomeric material comprising at least one monomer represented by the general formula (D) or a monomeric material comprising at least one monomer represented by the general formula (D) and at least one monomer represented by the general formula (E), and subsequently, radically halogenating the resulting polymer, in the form of a solution in a solvent or in the state swollen with a solvent, with an N-halogenated compound such as N-chlorosuccinimide, N-bromosuccinimide, N-bromoacetamide or the like in the presence of the said radical-generating agent or under the irradiation with light or ultraviolet-rays as described in, for example, the Journal of Americal Chemical Society, Vol. 74, 2189 (1952).

Examples of the monomer represented by the general formula (D) usable in the above-mentioned processes (1) and (2) include o-methylstyrene, m-methylstyrene, p-methylstyrene, p-ethylstyrene, o-ethylstyrene, m-ethylstyrene, p-methoxystyrene, o-methoxystyrene, m-methoxystyrene, α-methyl-p-methylstyrene, α-methyl-p-methoxystyrene and the like. These monomers may be used in combination of two or more. As the monomer represented by the general formula (E), α-methylstyrene and styrene may be used. These monomers may also be used in combination of two or more. As said other monomers to be polymerized with the monomer represented by the general formula (D) or with both the monomer represented by the general formula (D) and the monomer represented by the general formula (E), there may be used (meth)acrylic esters such as ethyl (meth)acrylate, butyl (meth)acrylate, glycidyl (meth)acrylate and the like, and aromatic vinyl compounds other than the monomers represented by the general formulas (D) and (E) such as α-vinylnaphthalene, β-vinylnaphthalene, 2-vinylpyridine, 4-vinylpyridine and the like; conjugated diene compounds such as butadiene, isoprene or the like as well as maleic anhydride, vinyl acetate and the like.

The proportion of the recurring unit represented by the general formula (B) to the total recurring units in the starting polymer is preferably 20 to 100%, more preferably 30 to 100%, in order to enhance the sensitivity to ionizing radiation. The proportion of the recurring unit represented by the general formula (C) to the total recurring units in the starting polymer is preferably 0 to 80%, more preferably 0 to 70%. The number average molecular weight of the starting polymer is preferably 8,000 to 150,000, more preferably 8,000 to 100,000.

In the above-mentioned process (1) or (2), the solvent used for halogenating, by radical reaction, the polymer of the monomeric material comprising the monomer (D) or both the monomer (D) and the monomer (E) is preferably a solvent having no interaction with a halogen radical. Particularly preferable for this purpose are benzene, halogenated hydrocarbons such as carbon tetrachloride, carbon tetrabromide, 1,1,2-trichloroethane and the like.

In the above-mentioned process (1) or (2), the degree of halogenation is controlled in the following manner: In the process (1), it is usually controlled by varying the amount of the compound having a halogen radical-generating ability. In the process (2), it is controlled by varying the amount of the N-halogenated compound.

The general reaction conditions in the above-mentioned processes (1) and (2) are as follows: The concentration of polymer to be halogenated in the reaction mixture is 3 to 20% by weight. When a radical-generating agent is used, the amount of the radical-generating agent is 0.01 to 5 parts by weight per 100 parts by weight of the polymer to be halogenated. The reaction temperature is 40° to 200° C.

In the case of halogenation under the irradiation with light or ultraviolet-rays, the intensity of light or ultraviolet-rays may be varied depending on the degree of halogenation.

In order to stabilize the ionizing radiation-sensitive resist, a stabilizer may be added in an amount of about 0.5 to 5% by weight. The stabilizer includes, for example, hydroxyaromatic compounds such as hydroquinone, methoxyphenol, p-t-butylcatechol, 2,2'-methylene-bis(6-t-butyl-4-ethylphenol) and the like; quinones such as benzoquinone, p-toluquinone, p-xyloquinone and the like; amines such as phenyl-α-naphthylamine, p,p'-diphenylphenylenediamine and the like; sulfur compounds such as dilauryl thiodipropionate, 4,4'-thio-bis(6-t-butyl-3-methylphenol), 2,2'-thio-bis(4-methyl-6-t-butylphenol), 2-(3,5-di-t-butyl-4-hydroxyanilino)-4,6-bis(N-octylthio)-s-triazine and the like; etc.

The process for forming patterns using the ionizing radiation sensitive resist of this invention comprises usually the steps of (1) forming a coating film of the ionizing radiation sensitive resist on a substrate using said resist in the form of an organic solvent solution, (2) irradiating the desired parts of the said coating film with an ionizing radiation, (3) treating said coating film with a developing agent, and (4) treating the said coating film with a rinsing agent.

In said step (1), as the organic solvent of the above organic solvent solution, there may be generally used petroleum fractions such as xylene, ethylbenzene, toluene and the like. Moreover, the concentration of the ionizing radiation sensitive resist in the organic solvent solution cannot be specified generally, and it is determined in accordance with thickness of the film formed by coating the resist. Usually, it is employed in the form of a solution having a concentration of 5 to 30% by weight.

In said step (2), the amount of the ionizing radiation irradiated may be varied depending upon the chemical structure, the molecular weight and the like of said ionizing radiation sensitive resist, and cannot be determined uniquely. However, the irradiation is effected until the desired parts of the said coating film is crosslinked with the ionizing radiation.

In said step (3), the treatment with the developing agent aims at dissolving the uncrosslinked portions of the said coating film to remove said portions from the film. This developing agent may be any solvent for dissolving said ionizing radiation sensitive resist and is not critical. Said solvent includes, organic solvents, for example, benzene, toluene, xylene, cyclohexane, ethylcyclohexane, decalin, Cellosolve acetate, methyl ethyl ketone, methyl isobutyl ketone, isoamyl acetate, 2-nitropropane, 1,1,2-trichloroethane and the like or organic solvent comprising them as major component. The temperature for treatment with the developing agent is usually 20° to 30° C., and the treatment time is usually 5 sec to 5 min.

In said step (4), the treatment with the rinsing agent aims at extracting the developing agent from the crosslinked parts of the coating film swollen by the treatment with said developing agent. The rinsing agent is not critical though it should be compatible with said developing agent and a poor solvent for said ionizing radiation sensitive resist. There may be used, as said rinsing agent, for example, organic solvents containing at least 10% by weight of an alcohol having 1 to 6 carbon atoms. As this alcohol, there may be used iso-butyl alcohol, tert-butyl alcohol, n-heptyl alcohol, 2-butyl alcohol, ethyl alcohol, methyl alcohol, ethylene glycol, amyl alcohol and the like. In addition, these alcohols may be used in admixture with the same solvents as used for the developing agent. The temperature for the treatment with said rinsing agent is usually 20° to 30° C., and the treating time is usually 5 sec to 5 min. The rinsing treatment may be conducted twice or thrice using different rinsing agents.

According to this invention, there can be provided a negative type ionizing radiation-sensitive resist, which is made insoluble in a developer upon irradiating with an ionizing radiation, can form a fine pattern with high accuracy, and has high resistance to dry etching.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein:

The FIGURE shows the characteristic curves regarding sensitivity, i.e. the relation between the yield of residual resist thickness and the irradiation energy, for Examples 3 and 4 and Comparative Example 2 (below).

This invention will be illustrated in more detail with reference to Examples and the accompanying drawings showing the characteristic curve regarding sensitivity of the coating film obtained in Examples 3 and 4 and Comparative Example 2. However, the Examples are merely by way of illustration and not by way of limitation.

EXAMPLE 1

A magnetic stirrer was introduced into a round-bottom flask, and the air in the flask was replaced with nitrogen. Under a stream of nitrogen, 320 g of cyclohexane and 35.4 g of p-methyl styrene were introduced to form a homogeneous solution, and then the temperaure of the solution was kept at 50° C. Subsequently, under a stream of nitrogen, 0.80 ml of a 0.50 mole/liter solution of n-butyllithium in cyclohexane was added to initiate the polymerization. The polymerization conversion reached 91.5% in 120 minutes. The resulting reaction mixture was poured into methanol containing 2,6-di-t-butyl-p-cresol to recover p-methylstyrene polymer. It was dried under reduced pressure at 40° C. for 16 hours. In a round-bottom flask was placed 11.8 g of the dried polymer, and the air in the flask was replaced with nitrogen, after which 224 g of carbon tetrachloride, 96 mg of 4,4'-azobisisobutyronitrile and 3.5 g of t-butyl hypochlorite were added and the resulting mixture was subjected to reaction for 90 minutes while keeping the temperature of the mixture at 70° C. The reaction mixture was poured into methanol containing 2,2'-methylene-bis(6-t-butyl-4-methylphenol) to separate the product which was then recovered. By analyzing the product by means of a $^1$H-nuclear magnetic resonance apparatus (JNM-4H-100, manufactured by Nippon Denshi), it was found that the peak due to the hydrogen of methyl group in the vicinity of $\delta = 2.2$ ppm and the peak due to the hydrogen of methine group in the vicinity of $\delta = 1.8$ ppm, which were seen in the starting polymer, became small. Moreover, by analyzing the product by means of a $^{13}$C-nuclear magnetic resonance apparatus (JNM-FX-100, manufactured by Nippon Denshi), absorption due to chloromethyl group was newly observed at $\delta = 46.1$ ppm and further absorptions due to

and due to

were observed at $\delta = 68-76$ ppm and $\delta = 51-55$ ppm, respectively. From this fact, it was confirmed that the methyl group in the polymer and the methylene and methine groups in the main chain were chlorinated. Analyzing in detail these nuclear magnetic resonance spectra, the recurring units (A-1), (A-2) and (A-3) were confirmed to be contained in proportions of 7.5%, 16% and 6.5%, respectively. Furthermore, the chlorine content was 8.3% by weight and the number average molecular weight was $4.5 \times 10^5$ as measured by a membrane osmometer.

The product obtained above was dissolved in xylene to form a 6.5% by weight solution. The solution was put on a silicon wafer having a thermally oxidized layer (0.7 $\mu$m in thickness), and the assembly was rotated first at 200 r.p.m. for 2 seconds and subsequently at 4,000 r.p.m. for 30 seconds to coat the solution on the wafer. The solvent was volatilized away by a heat-treatment at 80° C. for 30 minutes to obtain a coating film having a thickness of 0.5 $\mu$m formed on the wafer. After irradiating it with deep ultraviolet rays through a mask by means of an exposer (PLA-521 F, manufactured by CANON, INC.), it was developed with Cellosolve acetate for 1 minute and then rinsed with a mixed solution of methyl ethyl ketone and isopropyl alcohol (1:1 by volume) for 1 minute. As a result, it was found that an image of 0.6 $\mu$m could be resolved with a high fidelity to mask at irradiation energy of 6.8 mJ/cm$^2$.

EXAMPLE 2

A magnetic stirrer was placed in a round-bottom flask, and the air in the flask was replaced with nitrogen. Under a stream of nitrogen, 577 g of cyclohexane, 49.9 g of styrene and 14.2 g of o-methylstyrene were introduced into the flask to form a homogeneous solution, after which the temperature of the solution was kept at 60° C. Subsequently, under a stream of nitrogen, 2.4 ml of a 0.25 mole/liter solution of n-butyllithium in cyclohexane was added to the solution to initiate the polymerization. The polymerization conversion reached 100% in 60 minutes. Thus, the reaction mixture was poured into methanol containing 2,2'-methylene-bis(6-t-butyl-4-ethylphenol) to recover the resulting styrene-o-methylstyrene copolymer. The copolymer was dried under reduced pressure at 40° C. for 16 hours. Then, 10.7 g of the copolymer thus obtained was placed in a round-bottom flask and the air in the flask was replaced with nitrogen, after which 224 g of 1,1,2-trichloroethane, 96 mg of 4,4'-azobisisobutyronitrile and 4.2 g of N-chlorosuccinimide were added and the resulting solution was subjected to reaction for 1.5 hours while keeping the temperature of the solution at 70° C. The reaction product was poured into methanol containing 2,2'-methylene-bis(6-t-butyl-4-ethylphenol) to separate the product, which was then recovered. Its chlorine content was 7.0% by weight.

Analyzing the structure of the product in the same manner as in Example 1, it was confirmed that the recurring units (A-1), (A-2) and (A-3) were contained in proportions of 8.5%, 12% and 7.5%, respectively. Furthermore, the chlorine content was 8.5% by weight and the number average molecular weight was $2.3 \times 10^5$ as measured by a membrane osmometer.

The product obtained above was dissolved in xylene to form an 8.5% by weight solution. The solution was put on a silicon wafer having a thermally oxidized layer (0.7 μm in thickness) and the assembly was rotated first at 200 r.p.m. for 2 seconds and subsequently at 4,000 r.p.m. for 30 seconds to coat the wafer with the solution. The solvent was volatilized away by a heat-treatment at 80° C. for 30 minutes to obtain a coating film having a thickness of 0.5 μm formed on the wafer. After irradiating it with deep ultraviolet rays through a mask using an exposer, it was developed with Cellosolve acetate for 1 minute and then rinsed with a mixed solution of methyl ethyl ketone and isopropyl alcohol (1:1 by volume) for 1 minute. As a result, it was found that an image of 0.6 μm was resolved with a high fidelity to mask at a deep ultraviolet irradiation energy of 7.8 mJ/cm².

EXAMPLE 3

In the same manner as in Example 1, a coating film having a thickness of 0.5 μm was formed on silicon wafer having a thermally oxidized layer. Subsequently, the resulting assembly was irradiated with electron beams at an acceleration voltage of 20 kV, developed with Cellosolve acetate for 1 minute, and then rinsed with a mixed solution of methyl ethyl ketone and isopropyl alcohol (1:1 by volume) for 1 minute. As a result, the irradiation energy of the electron beams at the gel point was 0.45 μC/cm², and the characteristic curve regarding sensitivity (relation between the yield of residual resist thickness and the irradiation energy) was as shown in the accompanying drawings.

EXAMPLE 4

A magnetic stirrer was introduced into a round-bottom flask, and the air in the flask was replaced with nitrogen. Under a stream of nitrogen, 320 g of cyclohexane and 35.4 g of p-methylstyrene were introduced to form a homogeneous solution, and then the temperature of the solution was kept at 50° C. Subsequently, under a stream of nitrogen, 0.11 ml of a 0.25 mole/liter solution of n-butyllithium in cyclohexane was added to initiate the polymerization. The polymerization conversion reached 99% in 120 minutes. The resulting reaction mixture was poured into methanol containing 2,6-di-t-butyl-p-cresol to recover p-metylstyrene polymer. It was dried under reduced pressure at 40° C. for 16 hours. In a round-bottom flask was placed 11.8 g of the dried polymer, and the air in the flask was replaced with nitrogen, after which 150 ml of 1,1,2-trichloroethane, 95 mg of 4,4'-azobisisobutyronitrile and 4.0 g of t-butyl hypochlorite were added and the resulting mixture was subjected to reaction for 90 minutes while keeping the temperature of the mixture at 70° C. The reaction mixture was poured into methanol containing 2,2'-methylene-bis(6-t-butyl-4-methylphenol) to separate the product which was then recovered.

Analyzing the structure of the product in the same manner as in Example 1, it was confirmed that the recurring units (A-1), (A-2) and (A-3) were contained in proportions of 8%, 18% and 7%, respectively. The number average molecular weight of the product was $3 \times 10^5$ as measured by a membrane osmometer, and the chlorine content was 9.1% by weight. Using the product obtained above, a coating film having a thickness of 0.5 μm was formed on a silicon wafer having a thermally oxidized layer in the same manner as in Example 1, and was tested on electron beam irradiation characteristics. The coated silicon wafer was irradiated with electron beam at an acceleration voltage of 20 kV, and thereafter, development with Cellosolve acetate was conducted for 1 minute, and rinsing with a mixed solution of methyl ethyl ketone and isopropanol (1:1 by volume) was conducted for 1 minute. The characteristic curve regarding sensitivity of the coating film obtained is shown in the accompanying drawings. The irradiation energy at the gel point upon irradiation with electron beam was 0.3 μC/cm².

EXAMPLE 5

The image formed by irradiating with deep ultraviolet rays at 6.8 mJ/cm² in Example 1, the image formed by irradiating with deep ultraviolet rays at 7.8 mJ/cm² in Example 2, and the image formed by irradiating with electron beams at an acceleration voltage of 10 kV at 1.0 μC/cm² in Example 4 were subjected to reactive ion etching and the conditions that the power was 100 W, and the gas pressure was 15 Pa using tetrafluorocarbon/oxygen (95/5 volume ratio) as an etching gas in a parallel plate dry etching reactor to investigate the resistance to dry etching. The relative etching rates when the etch rate of the resist image formed by using the commercially available polymethyl methacrylate electron beam resist was assumed as 1.0 are shown in Table 1.

TABLE 1

| Image | Relative Etch Rate |
|---|---|
| Example 1 | 0.40 |
| Example 2 | 0.45 |
| Example 4 | 0.40 |

EXAMPLE 6

A magnetic stirrer was introduced into a round-bottom flask, and the air in the flask was replaced with nitrogen. Under a stream of nitrogen, 320 g of cyclohexane and 35.4 g of p-methyl styrene were introduced to form a homogeneous solution, and then the temperature of the solution was kept at 50° C. Subsequently, under a stream of nitrogen, 0.60 ml of a 0.50 mole/liter solution of n-butyllithium in cyclohexane was added to initiate the polymerization. The polymerization conversion reached 92.0% in 120 minutes. The resulting reaction mixture was poured into methanol containing 2,6-di-t-butyl-p-cresol to recover p-methylstyrene polymer. It was dried under reduced pressure at 40° C. for 16 hours. In a round-bottom flask was placed 11.8 g of the dried polymer, and the air in the flask was replaced with nitrogen, after which 236 g of benzene, 96 mg of 4,4'-azobisisobutyronitrile and 10.9 g of t-butyl hypochlorite were added and the resulting mixture was subjected to reaction for 90 minutes while keeping the temperature of the mixture at 70° C. The reaction mixture was poured into methanol containing 2,2'-methylene-bis(6-t-butyl-4-methylphenol) to separate the product which was then recovered. By analyzing the product by means of a ¹H-nuclear magnetic resonance apparatus (JNM-4H-100, manufactured by Nippon Denshi), it was found that the peak due to the hydrogen of methyl group in the vicinity of δ=2.2 ppm and the peak due to the hydrogen of methine group in the vicinity of δ=1.8 ppm, which peaks were observed in the starting polymer, became small. Furthermore, by analyzing the product by means of ¹³C-nuclear magnetic resonance apparatus (JNM-FX-100, manufactured by Nippon Denshi), absorption due to chloromethyl group was newly observed at δ=46.1 ppm, and absorption due to dichloromethyl group was also observed at δ=71.8 ppm. Moreover, there were also observed broad absorption due to

at δ=68-76 ppm and absorption due to

at δ=51-55 ppm. From this fact, it was confirmed that the methyl group of the polymer and methylene and methine groups in the main chain had been chlorinated. Therefore, it was confirmed that the resulting polymer contained the following recurring units belonging to the recurring units (A-1), (A-2) and (A-3):

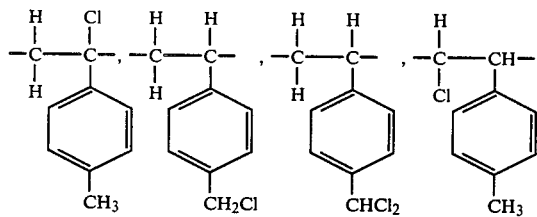

Further, the chlorine content was 20.9% by weight and the number average molecular weight was 6.0×10⁵ as measured by a membrane osmometer.

The product obtained above was dissolved in xylene to prepare a 4.8% by weight solution, and this solution was placed on a silicon wafer having a thermally oxidized layer having a thickness of 0.7 μm, and coating was conducted by rotating the silicon wafer at 200 rpm for 2 sec and subsequently at 4,000 rpm for 30 sec. Further, the coated silicon wafer was heat-treated at 80° C. for 30 min. to volatilize the solvent away, upon which a coating film having a thickness of 0.5 μm was formed on the wafer. This sample was irradiated through a mask with aluminum Kα rays as the X-rays, and then developed with Cellosolve acetate for 1 min, and subsequently rinsed with a mixed solution of methyl ethyl ketone/isopropanol (1:1 by volume) for 1 min. As a result, it was found that an image having a line width of 0.6 μm was resolved with a fidelity to the mask at an X-rays irradiation energy of 14 mJ/cm².

EXAMPLE 7

A magnetic stirrer was introduced into a round-bottom flask, and the air in the flask was replaced with nitrogen. Under a stream of nitrogen, 320 g of cyclohexane and 35.4 g of p-methylstyrene were introduced to form a homogeneous solution, and then the temperature of the solution was kept at 50° C. Subsequently, under a stream of nitrogen, 0.45 ml of a 0.25 mole/liter solution of n-butyllithium in cyclohexane was added to initiate the polymerization. The polymerization conversion reached 100% in 120 minutes. The resulting reaction mixture was poured into methanol containing 2,6-di-t-butyl-p-cresol to recover p-methylstyrene polymer. It was dried under reduced pressure at 40° C. for 16 hours. In a round-bottom flask was placed 11.8 g of the dried polymer, and the air in the flask was replaced with nitrogen, after which 236 g of benzene, 96 mg of 4,4'-azobisisobutyronitrile and 41 g of t-butyl hypochlorite were added and the resulting mixture was subjected to reaction for 90 minutes while keeping the temperature of the mixture at 70° C. The reaction mixture was poured into methanol containing 2,2'-methylene-bis(6-t-butyl-4-methylphenol) to separate the product which was then recovered.

In the same manner as in Example 6, the structure of the product was analyzed to confirm that the product contained the following recurring units belonging to the recurring units (A-1), (A-2) and (A-3):

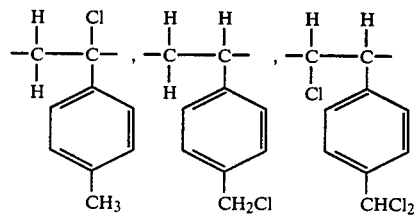

The chlorine content was 90% by weight, and the number average molecular weight was 4.0×10⁵ as measured by a membrane osmometer.

The product obtained above was dissolved in xylene to prepare a 5.5% by weight solution, and this solution was placed on a silicon wafer having a thermally oxidized layer having a thickness of 0.7 μm, and coating was conducted by rotating the silicon wafer at 200 rpm for 2 sec and subsequently at 4,000 rpm for 30 sec. The thus coated silicon wafer was heat-treated at 80° C. for 30 min to volatilize the solvent away, upon which a coating film having a thickness of 0.5 μm was formed on the wafer. This sample as irradiated through a mask with aluminum Kα rays as the X-rays, thereafter developed with Cellosolve acetate for 1 min, and then rinsed with a mixed solution of methyl ethyl ketone and isopropanol (1:1 by volume) for 1 min. As a result, it was found that an image having a line width of 0.6 μm was resolved with a fidelity to the mask at an X-rays irradiation energy of 40 mJ/cm².

EXAMPLE 8

A magnetic stirrer was introduced into a round-bottom flask, and the air in the flask was replaced with nitrogen. Under a stream of nitrogen, 577 g of cyclohexane, 49.9 g of styrene and 14.2 g of o-methylstyrene were introduced to form a homogeneous solution, and then the temperature of the solution was kept at 60° C. Subsequently, under a stream of nitrogen, 2.4 ml of a 0.25 mole/liter solution of n-butyllithium in cyclohexane was added to initiate the polymerization. The polymerization conversion reached 100% in 60 minutes. The resulting reaction mixture was poured into methanol containing 2,6-di-t-butyl-p-cresol to recover styrene-o-methylstyrene copolymer. It was dried under reduced pressure at 40° C. for 16 hours. In a round-bottom flask was placed 10.7 g of the dried copolymer, and the air in the flask was replaced with nitrogen, after which 230 g of benzene, 96 mg of 4,4'-azobisisobutyronitrile and 20.0 g of N-chlorosuccinimide were added and the resulting mixture was subjected to reaction for 90 minutes while keeping the temperature of the mixture at 70° C. The reaction mixture was poured into methanol containing 2,2'-methylene-bis(6-t-butyl-4-methylphenol) to separate the product which was then recovered.

In the same manner as in Example 6, the structure of the product was analyzed, to find that the product contained the following recurring units belonging to the recurring units (A-1), (A-2) and (A-3):

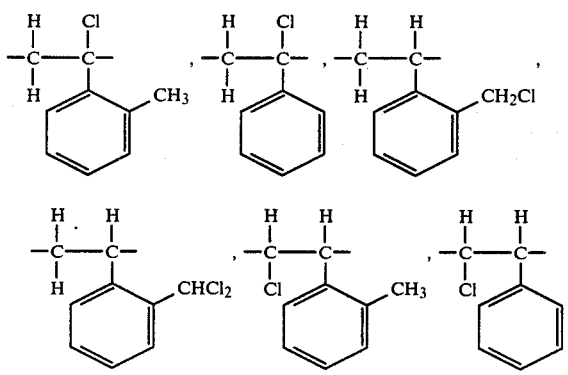

The chlorine content was 28.8% by weight, and the number average molecular weight was $3.0 \times 10^5$ as measured by a membrane osmometer.

The product obtained above was dissolved in xylene to prepare a 8.5% by weight solution, and this solution was placed on a silicon wafer having a thermally oxidized layer having a thickness of 0.7 μm, and coating was conducted by rotating the silicon wafer at 200 rpm for 2 sec and then at 4,000 rpm for 30 sec. The coated silicon wafer was further heat-treated at 80° C. for 30 min to volatilize the solvent away, upon which a coating film having a thickness of 0.5 μm was formed on the water. This sample was irradiated through a mask with aluminum Kα-rays as the X-rays, thereafter developed with Cellosolve acetate for 1 min and then rinsed with a mixed solution of methyl ethyl ketone and isopropanol (1:1 by volume) for 1 min. As a result, it was confirmed that an image having a line width of 0.6 μm was resolved with a fidelity to the mask at an X-rays irradiation energy of 13 mJ/cm².

EXAMPLE 9

In the same manner as in Example 5, the dry etching resistance of the resist patterns obtained in Examples 6 to 8 was tested, to obtain the results shown in Table 2.

TABLE 2

| Image | Relative Etch Rate |
| --- | --- |
| Example 6 | 0.42 |
| Example 7 | 0.40 |
| Example 8 | 0.43 |

COMPARATIVE EXAMPLE 1

A magnetic stirrer was placed into a round-bottom flask and the air in the flask was replaced with nitrogen. Under a stream of nitrogen, 481 g of cyclohexane and 52 g of styrene were introduced to form a homogeneous solution, after which the temperature of the solution was kept at 60° C. Subsequently, under a stream of nitrogen, 1.42 ml of a 0.25 mole/liter solution of n-butyllithium in cyclohexane was added to initiate the polymerization. The reaction temperature rose to 70.5° C., and the polymerization conversion reached 100% in 120 minutes. Thus, the reaction mixture was poured into methanol containing 2,2'-methylene-bis(6-t-butyl-4-ethylphenol) to recover the styrene polymer. The polymer was dried under reduced pressure at 40° C. for 16 hours. Then, 10.4 g of the polymer thus obtained was introduced into a round-bottom flask and the air in the flask was replaced with nitrogen, after which 224 g of carbon tetrachloride, 9.7 mg of benzoyl peroxide and 60 g of t-butyl hypochlorite were added to the flask and the resulting solution was subjected to reaction for 4 hours while keeping the temperature of the solution at 90° C. The reaction mixture was poured into methanol containing 2,2'-methylene-bis(6-t-butyl-4-ethylphenol) to separate the product, which was then recovered.

In the same manner as in Example 1, the structure of the product was analyzed to find that 61% of the styrene unit, 21% of the recurring unit (A-1), and 18% of the recurring unit (A-3) were contained. The chlorine content was 11.8% by weight and the number average molecular weight was $6.5 \times 10^5$ as measured by a membrane osmometer.

The product obtained above was formed into a solution in the same manner as in Example 1, and then the solution was coated on a silicon wafer having a thermally oxidized layer by the same procedure as in Example 1. Further, it was irradiated with deep ultraviolet rays, developed and rinsed in the same manner as in Example 1. As a result, an image of 5 μm or more could barly be resolved at a radiation energy of 65 mJ/cm².

What is claimed is:

1. A process for forming patterns comprising (1) forming a coating film of an ionizing radiation sensitive resist on a substrate using said resist in the form of an organic solvent solution, (2) irradiating the desired parts of said coating film with ionizing radiation, (3) treating said coating film with a developing agent, and (4) treating said coating film with a rinsing agent, characterized in that said ionizing radiation sensitive resist is a polymer having a recurring unit represented by the general formula (A):

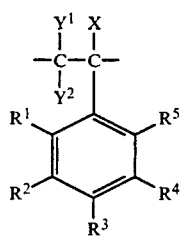

wherein X is a hydrogen atom, a methyl group or a halogen atom, and further wherein X is a halogen atom in at least 2% of the recurring units of the polymer; $Y^1$ and $Y^2$ are independently hydrogen atoms, methyl groups or halogen atoms, and further wherein $Y^1$ or $Y^2$ is a halogen atom in at least 2% of the recurring units of the polymer; $R^1$, $R^2$, $R^3$, $R^4$ and $R^5$ are independently hydrogen atoms, alkyl groups having 1 to 3 carbon atoms, alkoxy groups having 1 to 3 carbon atoms, halogen atoms, haloalkyl groups having 1 to 3 carbon atoms or haloalkoxy groups having 1 to 3 carbon atoms, and further wherein at least one of $R^1$, $R^2$, $R^3$, $R^4$ and $R^5$ is either a haloalkyl or haloalkoxy group containing 1 to 3 carbon atoms in at least 3% of the recurring units of the polymer.

2. A process according to claim 1, wherein the number average molecular weight of the resist is 10,000 to 1,500,000.

3. A process according to claim 2, wherein the halogen content of the resist is 1 to 50% by weight.

4. A process according to claim 3, wherein the resist contains the following recurring units (A-1), (A-2) and (A-3) in a total proportion of 7 to 70% of the number of the total recurring units in the polymer:

the recurring unit (A-1) is the recurring unit represented by the general formula (A) wherein X is a halogen atoms.

the recurring unit (A-2) is the recurring unit represented by the general formula (A) wherein at least a part of the $R^1$, $R^2$, $R^3$, $R^4$ and $R^5$ groups is a haloalkyl group having 1 to 3 carbon atoms or a haloalkoxy group having 1 to 3 carbon atoms, and the recurring unit (A-3) is the recurring unit represented by the general formula (A) wherein at least a part of the $Y^1$ and $Y^2$ groups is a halogen atom.

5. A process according to claim 3, wherein the resist has been prepared by radically halogenating a polymer comprising a recurring unit represented by the general formula (B),

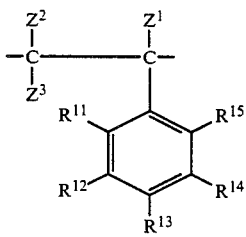

wherein $R^{11}$, $R^{12}$, $R^{13}$, $R^{14}$ and $R^{15}$ are independently hydrogen atoms, alkyl groups having 1 to 3 carbon atoms, or alkoxy groups having 1 to 3 carbon atoms, provided that the case where $R^{11}$, $R^{12}$, $R^{13}$, and $R^{15}$ are all hydrogen atoms is excluded, and $Z^1$, $Z^2$ and $Z^3$ are independently hydrogen atoms, fluorine atoms or methyl groups, provided that where $Z^1$ is methyl $Z^2$ and $Z^3$ are hydrogen atoms, alone or in combination with a recurring unit represented by the general formula (C),

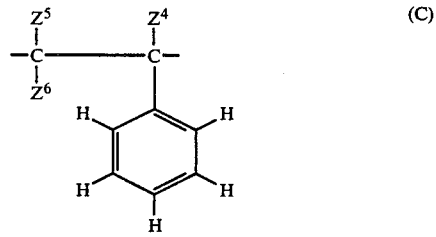

wherein $Z^4$, $Z^5$ and $Z^6$ are independently hydrogen atoms, fluorine atoms, or methyl groups, provided that when $Z^1$ in the recurring unit represented by the general formula (B) is methyl $Z^4$ is a hydrogen atom.

6. A process according to claim 5, wherein the starting polymer contains 20 to 100% of the recurring unit represented by the general formula (B), 0 to 70% of the recurring unit represented by the general formula (C), and 0 to 50% of other recurring units.

7. A process according to claim 1, wherein the proportion of the recurring unit wherein X is a halogen atom is not more than 25% of the number of the total recurring units of the polymer, the proportion of the recurring unit wherein $Y^1$ or $Y^2$ is a halogen atom is not more than 25% of the number of the total recurring units of the polymer, and the proportion of the recurring unit wherein at least one of $R^1$, $R^2$, $R^3$, $R^4$ and $R^5$ is either a haloalkyl or haloalkoxy group having 1 to 3 carbon atoms is not more than 40% of the number of the total recurring units of the polymer.

8. A process according to claim 5, wherein the number average molecular weight of the starting polymer is 8,000 to 150,000.

9. A process according to claim 8, wherein the starting polymer dissolved in or swollen with a solvent is radically halogenated with a compound having a halogen radical-generating ability in the presence of a radical-generating agent or under irradiation with light or ultraviolet rays.

10. A process according to claim 8, wherein the starting polymer dissolved in or swollen with a solvent is radically halogenated with a N-halogenated compound in the presence of a radical-generating agent or under irradiation with light or ultraviolet rays.

11. A process according to claim 9 or 10, wherein the radical-generating agent is 4,4-azobisisobutyronitrile, benzoyl peroxide or lauroyl peroxide.

12. A process according to claim 9, wherein the compound having halogen radical-generating ability is t-butyl hypochlorite, t-butyl hypoiodite, chlorine, or iodine.

13. A process according to claim 10, wherein the N-halogenated compound is N-chlorosuccinimide, N-bromosuccinimide or N-bromoacetamide.

* * * * *